United States Patent
Kirchhoff

(10) Patent No.: US 6,580,311 B2
(45) Date of Patent: Jun. 17, 2003

(54) CIRCUIT CONFIGURATION FOR SUPPLYING VOLTAGE TO AN INTEGRATED CIRCUIT VIA A PAD

(75) Inventor: Hans-Gerd Kirchhoff, Ratingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/066,875

(22) Filed: Feb. 4, 2002

(65) Prior Publication Data

US 2002/0089367 A1 Jul. 11, 2002

Related U.S. Application Data

(63) Continuation of application No. PCT/EP00/07605, filed on Aug. 4, 2000.

(30) Foreign Application Priority Data

Aug. 4, 1999 (DE) .......................... 199 36 606

(51) Int. Cl.[7] .................................................. H02J 1/00
(52) U.S. Cl. ...................... 327/530; 327/468; 327/410; 307/85; 307/87; 307/130
(58) Field of Search ................................ 327/143, 198, 327/407, 408, 409, 410, 530, 545; 307/85, 86, 87, 126, 130

(56) References Cited

U.S. PATENT DOCUMENTS

| | | | | |
|---|---|---|---|---|
| 4,617,473 A | * | 10/1986 | Bingham | 307/66 |
| 4,893,029 A | * | 1/1990 | Matsuo et al. | 327/543 |
| 4,900,950 A | * | 2/1990 | Dubujet | 327/143 |
| 4,970,408 A | * | 11/1990 | Hanke et al. | 327/143 |
| 5,039,875 A | * | 8/1991 | Chang | 327/143 |
| 5,539,338 A | | 7/1996 | Moreland | 327/19 |
| 5,936,447 A | * | 8/1999 | Haigis | 327/198 |

FOREIGN PATENT DOCUMENTS

| | | |
|---|---|---|
| DE | 198 08 525 A1 | 9/1999 |
| JP | 09 167 828 A | 6/1997 |
| WO | WO 99/22289 | 5/1999 |

* cited by examiner

*Primary Examiner*—Terry D. Cunningham
(74) *Attorney, Agent, or Firm*—Laurence A. Greenberg; Werner H. Stemer; Ralph E. Locher

(57) ABSTRACT

A circuit configuration for supplying voltage to an integrated circuit via a pad that is connected to the input of a Schmitt trigger on the integrated circuit. The pad is also provided for configuring the integrated circuit. The integrated circuit has a multiplicity of voltage supply lines for voltage supply purposes. According to the invention, the pad is connected to a respective voltage supply line via a respective switch, and the switches are switched on or off by a control circuit that is controlled by at least one on-chip control signal.

5 Claims, 2 Drawing Sheets

CIRCUIT CONFIGURATION FOR SUPPLYING VOLTAGE TO AN INTEGRATED CIRCUIT VIA A PAD

CROSS-REFERENCE TO RELATED APPLICATION

This application is a continuation of copending International Application No. PCT/EP00/07605, filed Aug. 4, 2000, which designated the United States.

BACKGROUND OF THE INVENTION

FIELD OF THE INVENTION

The invention relates to a circuit configuration and a method for supplying voltage to an integrated circuit through a pad that is also used to configure the integrated circuit.

One of the most important goals in developing integrated circuits is to save valuable chip area. The smaller an integrated circuit, the higher the effective yield per wafer during fabrication. The chip housing into which the integrated circuit is incorporated forms a further cost factor. In this case, the type of housing is determined principally by the number of pads or terminals of the integrated circuit. In order to be able to use an inexpensive chip housing, therefore, endeavors are made to save pads during the development of integrated circuits.

In complex integrated circuits such as microprocessors or complicated microcontrollers, many of the pads present are provided exclusively for voltage supply purposes. If some of the pads provided for voltage supply purposes are dispensed with in favor of a less expensive housing, however, there is an increase in the risk of functional disturbances because of a possibly excessively low current supply via the remaining pads for the voltage supply. In addition, the chip becomes more sensitive to external interference because of EMC (electromagnetic compatibility). Furthermore, the chip itself radiates to a greater extent and can thus interfere with other chips or components in an electronic system. Functional pads or pads that are provided for testing can rarely be dispensed with.

SUMMARY OF THE INVENTION

It is accordingly an object of the invention to provide a circuit for supplying voltage to an integrated circuit and a method for supplying the voltage to the integrated circuit which overcome the above-mentioned disadvantages of the prior art apparatus and methods of this general type.

In particular, is an object of the invention to provide a circuit and a method that enables a circuit designer to save pads when supplying voltage to an integrated circuit, without accepting the disadvantages mentioned in the introduction.

With the foregoing and other objects in view there is provided, in accordance with the invention, a circuit that includes: an integrated circuit having a plurality of voltage supply lines, a pad for configuring the integrated circuit, and a Schmitt trigger having an input connected to the pad; and a circuit configuration for supplying voltage to the integrated circuit through the pad. The circuit configuration includes switches in which each one of the switches is for connecting the pad to a respective one of the plurality of the voltage supply lines. The circuit configuration includes a control circuit for switching the switches on and off. The control circuit is controlled by at least one on-chip control signal.

In accordance with an added feature of the invention, the circuit configuration includes driver circuits; the control circuit switches each one of the switches on and off with a respective one of the driver circuits; and the driver circuits has inputs connected to the pad.

In accordance with an additional feature of the invention, the circuit configuration includes resistors; the driver circuits have outputs; and each one of the outputs of the driver circuits is connected to one of the plurality of the voltage supply lines by a respective one of the resistors.

In accordance with another feature of the invention, the plurality of the voltage supply lines include a first voltage supply line and a second voltage supply line; the switches include a first switch and a second switch; the first switch connects the pad to the first voltage supply line; and the second switch connects the pad to the second voltage supply line.

In accordance with a further feature of the invention, the switches are MOS transistors.

In accordance with a further added feature of the invention, the switches are bipolar transistors.

In accordance with a further additional feature of the invention, the circuit configuration includes a third transistor having a load path and a control terminal; the load path of the third transistor connects the pad to a line selected from the group consisting of the first voltage supply line and the second voltage supply line; and the control terminal of the third transistor is connected to a line selected from the group consisting of the first voltage supply line and the second voltage supply line.

With the foregoing and other objects in view there is also provided, in accordance with the invention, a method for supplying voltage to and configuring an integrated circuit via a pad. The method includes steps of: providing an integrated circuit having a plurality of voltage supply lines, a pad for configuring the integrated circuit, and a Schmitt trigger having an input connected to the pad; providing a circuit configuration for supplying voltage to the integrated circuit through the pad; providing the circuit configuration with switches; providing each one of the switches for connecting the pad to a respective one of the plurality of the voltage supply lines; providing the circuit configuration with a control circuit for switching the switches on and off; controlling the control circuit with at least one on-chip control signal; and providing a voltage at the pad to supply the voltage to one of the plurality of the voltage supply lines of the integrated circuit and to configure the integrated circuit.

The invention relates to a circuit configuration for supplying voltage to an integrated circuit via a pad. The pad is connected to the input of a Schmitt trigger on the integrated circuit and is provided for configuring the integrated circuit. The integrated circuit has a multiplicity of voltage supply lines for voltage supply purposes. According to the invention, the pad is connected to a respective voltage supply line via a respective switch and the switches are switched on or off by a control circuit that is controlled by at least one on-chip control signal.

In many integrated circuits, in particular in ones that are highly complex, some pads are provided for configuring the integrated circuit. For example, these pads can be used to set a specific operating mode or to switch the integrated circuit into a test mode for testing specific modules. In an electronic system, these pads are continuously connected to a supply voltage of the integrated circuit during the operation of the integrated circuit. Accordingly, these pads which are actually provided for configuring the integrated circuit can also be used for voltage supply purposes. The actual function of the pad is not impaired thereby, but rather is preserved. However, the integrated circuit can be supplied, via the pad, only with the voltage that is present for configuration purposes. To that end, according to the invention, switches that connect the pad, in each case, to one of the supply voltages of the integrated circuit are provided on the integrated circuit. This advantageously means that pads for the supply voltage can be saved.

Preferably, the control circuit switches the switches on or off via a respective driver circuit. The inputs of the driver circuits are directly connected to the pad. To that end, the control circuit blocks or unblocks the driver circuits that use a voltage present at the pad for switching the switches.

The outputs of the driver circuits are preferably connected to one of the supply voltages on the integrated circuit via a respective resistor. This effects a pull function, so that, even when the driver circuits are turned off, the driver outputs are at a defined potential and the switches are switched on or off in a defined manner.

In particular, the switches are embodied as power transistors. In order to supply the integrated circuit with sufficient current via the pad, power transistors are particularly suitable for a high current flow via the pad. By contrast, simple transistors would only limit the possible supply current via the pad.

In one embodiment of the invention, the integrated circuit preferably has a first supply voltage line, a second supply voltage line, a first switch, and a second switch. The first switch connects the pad to the first supply voltage line and the second switch connects the pad to the second supply voltage line. Nowadays, many integrated circuits are supplied with two supply voltages, for example 5 V and 0 V. In this case, precisely two switches are required for embodying the invention, which switches connect the pad for example to 5 V and 0 V.

The pad is preferably connected to the first supply voltage and to the second supply voltage via the load path of a third transistor and the load path of a fourth transistor, respectively. The control terminal of the third transistor is connected to the second supply voltage and the control terminal of the fourth transistor is connected to the first supply voltage. In this embodiment of the invention, "floating" of the pad is avoided and the pad is at a defined potential as long as no external voltage is present.

In particular, the first and second transistors are embodied as MOS transistors. This embodiment is advantageous when the integrated circuit is fabricated using purely MOS technology. As an alternative, the first and second transistors may be embodied as bipolar transistors. If the integrated circuit is fabricated using BiCMOS technology, this embodiment is appropriate since bipolar transistors are particularly suitable as current sources and cope with very large currents.

The invention furthermore relates to a method for supplying voltage to and for configuring an integrated circuit using a pad at which a voltage is present. The voltage on the pad is used both for configuring the integrated circuit and for providing a supplying voltage to the integrated circuit.

Other features which are considered as characteristic for the invention are set forth in the appended claims.

Although the invention is illustrated and described herein as embodied in a circuit configuration for supplying voltage to an integrated circuit via a pad, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
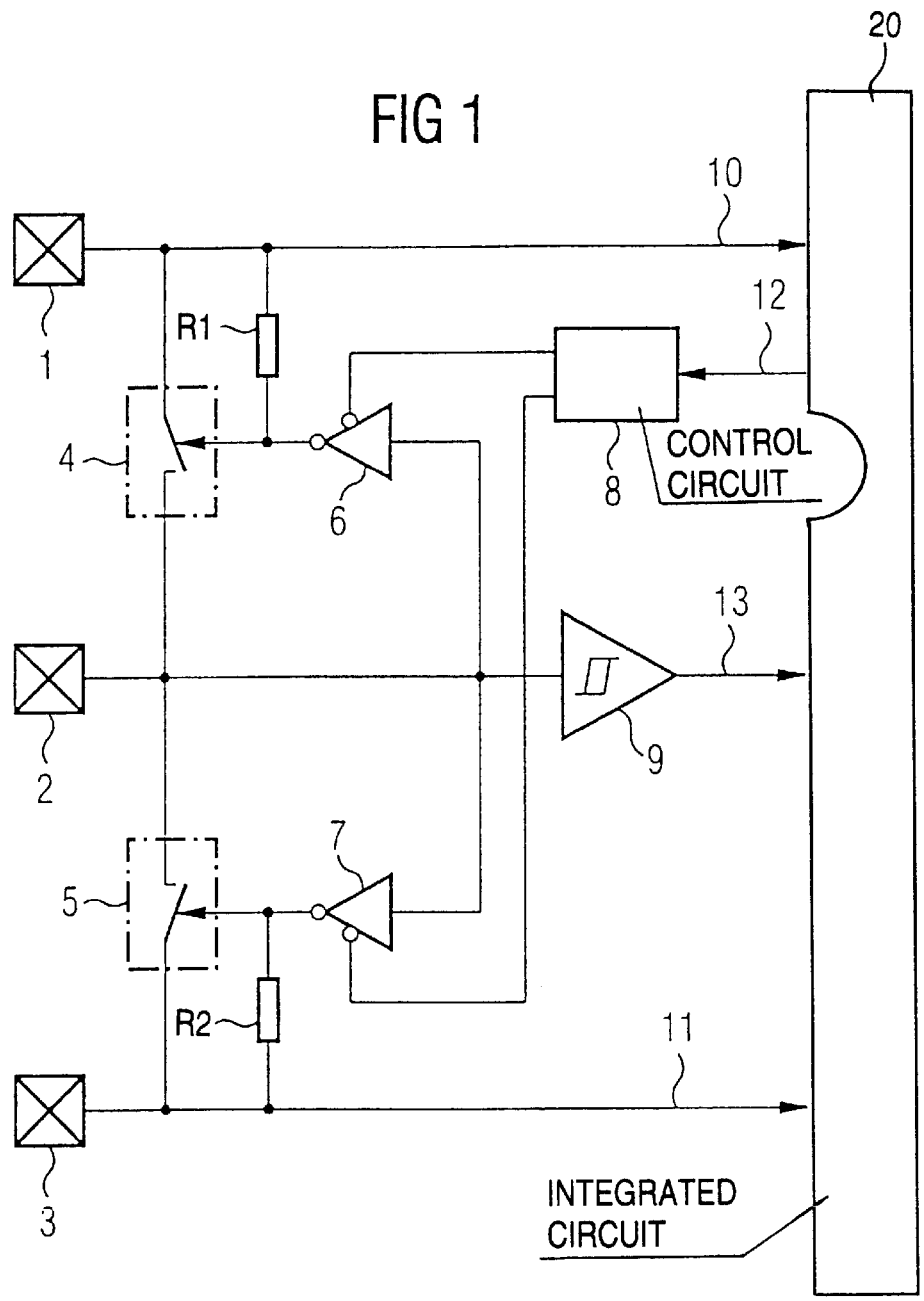
FIG. 1 shows a basic embodiment of a circuit configuration for supplying voltage to an integrated circuit via a pad.

Referring now to the figures of the drawing in detail and first, particularly, to FIG. 1 thereof, there is schematically shown an integrated circuit 20. The illustration shows a first pad 1 for supplying voltage to the integrated circuit 20 with a first voltage supply line 10, which carries 5 V, for example, a second pad 2 for configuring the integrated circuit 20, and a third pad 3 for connecting the integrated circuit 20 to a reference-ground potential line 11, which has a potential of 0 V, for example.

The second pad 2 is connected to a Schmitt trigger 9, whose output signal 13 serves for configuring the integrated circuit 20. In this case, the Schmitt trigger 9 generates, from a voltage present at the second pad 2, a logic level that is suitable for further processing in the integrated circuit 20. Moreover, the Schmitt trigger 9 filters away interference voltages at the pad 2.

The second pad 2 is connected to the first voltage supply line 10 via a first switch 4. Furthermore, a second switch 5 connects the second pad 2 to the reference-ground potential line 11.

The first switch 4 is driven by a first tristate inverter 6. The second switch 5 is driven by a second tristate inverter 7. The first tristate inverter 6 and the second tristate inverter 7 are turned on or off by a control circuit 8. The control circuit 8 is driven by an on-chip signal 12, for example, a RESET signal. The input of the first tristate inverter 6 and the input of the second tristate inverter 7 are connected to the second pad 2. The output of the first tristate inverter 6 is connected to the voltage supply line 10 by a resistor R1. The output of the second tristate inverter 7 is connected to the reference-ground potential line 11 by resistor R2.

During operation of the circuit configuration, an external voltage of, for example, 5 V for configuration purposes is present at the second pad 2. In this case, the external voltage can be used not only for configuring the integrated circuit 20, but also for supplying a voltage of 5V to the integrated circuit 20. The control circuit 8 turns the two tristate inverters 6 and 7 on. The external voltage is present at the inputs of the two tristate inverters 6 and 7. Both tristate inverters 6 and 7 invert the voltage and feed the inverted voltage to the first switch 4 and the second switch 5, respectively. The control input of the first switch 4 is inverted relative to the control input of the second switch 5, so that only the first switch 4 is switched on and the second switch 5 remains open. Consequently, the second pad 2 is connected to the voltage supply line 10 and the external voltage supplies the integrated circuit with 5 V via the second pad 2 and the first switch 4. If the integrated circuit is not intended to be supplied via the second pad 2, the control circuit 8 turns the two tristate inverters 6 and 7 off. In this case, the resistors R1 and R2 have the effect that the first supply voltage and the reference-ground potential are present at the input of the first switch 4 and of the second switch 5, respectively. Both switches are then open and the connection between the second pad 2 and the voltage supply line 10 and also the reference-ground potential line 11 is disconnected.

Figure 2:
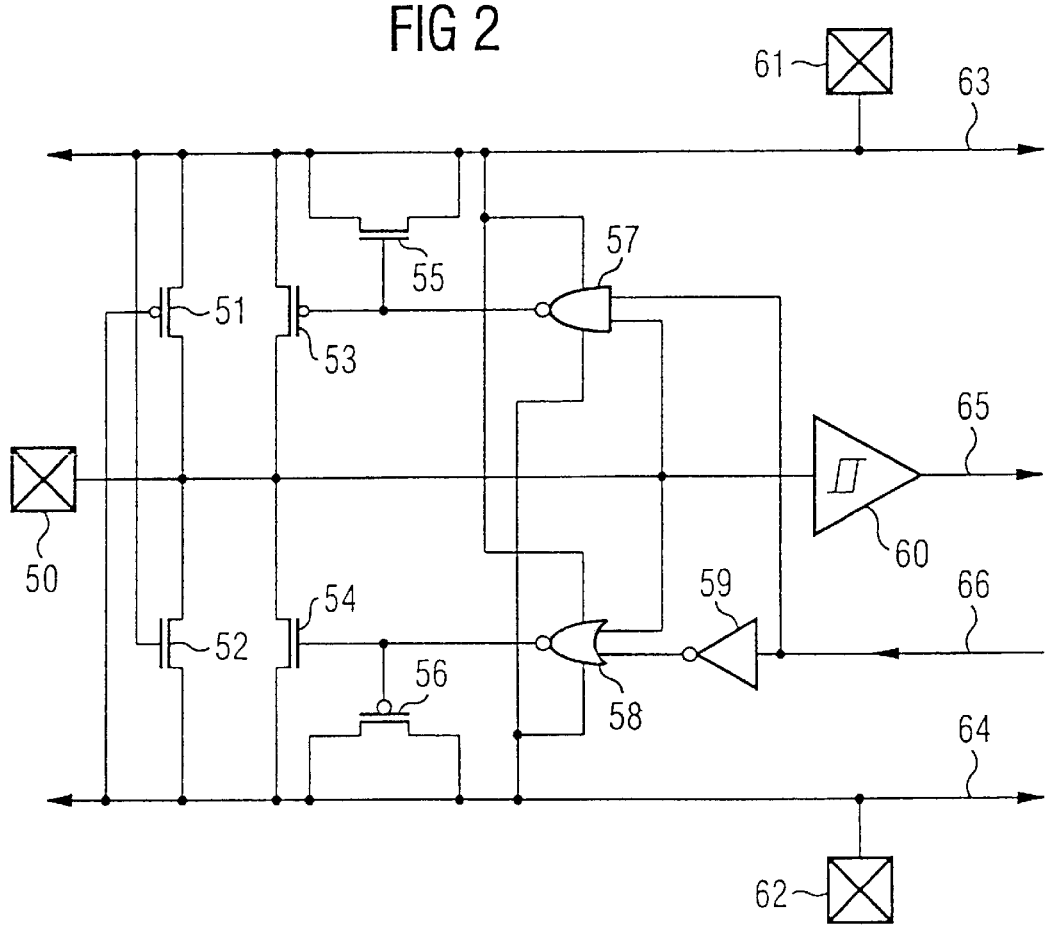
FIG. 2 shows a practical realization of the circuit configuration for supplying voltage to an integrated circuit via a pad using MOS technology.

FIG. 2 likewise illustrates a detail from an integrated circuit. A first pad 61 serves for supplying voltage to the integrated circuit with a first voltage supply line 63, which carries 5 V for example. The integrated circuit is connected to a reference-ground potential via a third pad 62. To that end, the third pad is connected to a reference-ground potential line 64 on the integrated circuit. A second pad 50 serves for configuring the integrated circuit.

The second pad is connected to a Schmitt trigger 60 whose output signal 65 is passed to an internal module of the integrated circuit, where it sets a specific operating mode of the integrated circuit. In this case, the Schmitt trigger 60 generates, from a voltage present at the second pad 50, a logic level that corresponds to one of the logic levels used on the integrated circuit. Moreover, the Schmitt trigger 60 filters away interference voltages at the second pad 50. The circuit disclosed in Published German Patent DE 44 27 015 C1 is particularly suitable as a Schmitt trigger.

The second pad 50 is connected to the first voltage supply line 63 via the load path of a first p-channel MOS transistor 53. Furthermore, the load path of a first n-channel MOS transistor 54 connects the second pad 50 to the reference-ground potential line 64. The first p-channel MOS transistor 53 and the first n-channel MOS transistor 54 are designed as power transistors in order to supply the integrated circuit with current via the second pad 50.

The first p-channel MOS transistor 53 is driven by a NAND gate 57. The first n-channel MOS transistor 54 is driven by a NOR gate 58. A first input of the NAND gate 57 is driven by an "enable" signal 66 of the integrated circuit. Moreover, the "enable" signal 66 drives a first input of the NOR gate 58 via an inverter 59. A second input of the NAND gate 57 and of the NOR gate 58 are connected to the second pad 54. If the "enable" signal 66 is logic zero, then the voltage supply via the second pad 50 is turned off.

The load path of a second p-channel MOS transistor 51 or of a second n-channel MOS transistor 52 likewise connects the second pad 50 to the corresponding voltage supply line. If the second p-channel MOS transistor 51 is arranged in the circuit, then the gate of the second p-channel MOS transistor 51 is connected to the reference-ground potential line 64 so that the second p-channel MOS transistor 51 is always switched on and puts the second pad 50 at a defined potential. If the second n-channel MOS transistor 52 is present in the circuit, then the gate of the second n-channel MOS transistor 52 is connected to the first supply voltage line 63, so that the second p-channel MOS transistor 52 is always switched on and puts the second pad 50 at a defined potential. In other words, the p-channel MOS transistor 51 and the n-channel MOS transistor 52 are never integrated simultaneously in the circuit, but rather are intended only to set the basic state. Therefore, if a positive default value is necessary for the Schmitt trigger 60, then the p-channel MOS transistor 51 is used, otherwise the n-channel MOS transistor 52 is used for a negative default value of the Schmitt trigger 60. To cover the two variants both transistors 51, 52 are inserted in FIG. 2, even though they are not present simultaneously in a corresponding circuit.

The gate of a third n-channel MOS transistor 55 and the gate of a third p-channel MOS transistor 56 are connected to the output of the NAND gate 57 and of the NOR gate 58, respectively, and in each case forms a capacitance that delays the switching-on of the first p-channel MOS transistor 53 and of the first n-channel MOS transistor 56, respectively. Miller capacitances are also formed that positively feedback internal interference/voltage spikes of the supply lines 63 or 64 to the gates of the power transistors 53 and 54, respectively. The Miller capacitance is the effect that is principally desired. As a result, the power transistors 53 and 54 are activated to an even greater extent, which reduces their $RDS_{on}$ even further, so that the interference/voltage spikes are additionally attenuated. The load path of the third p-channel MOS transistor 56 and of the third n-channel MOS transistor 55 are connected in parallel with the reference-ground potential line 64 and the voltage supply line 63, respectively, and act as a Miller capacitance.

If the integrated circuit is connected to the supply voltage and the reference-ground potential via the first pad 61 and the third pad 62, respectively, the "enable" signal 66 is initially logic zero and the first p-channel MOS transistor 53 and the first n-channel MOS transistor 54 are turned off. The second pad 50 thus serves only for configuring the integrated circuit. As soon as the integrated circuit starts to operate, the "enable" signal 66 can change to logic one. Depending on which logic level is present in accordance with the external voltage at the second pad 50, either the output of the NAND gate 57 changes to logic zero (logic level at the second pad 50: one) and the output of the NOR gate 58 changes to logic zero or the output of the NAND gate 57 changes to logic one (logic level at the second pad 50: zero) and the output of the NOR gate 58 changes to logic one. The first p-channel MOS transistor 53 is turned on and the first n-channel MOS transistor 54 is turned off, or the first p-channel MOS transistor 53 is turned off and the first n-channel MOS transistor 54 is turned on. In parallel, the external voltage at the second pad 50 is forwarded via the Schmitt trigger 60 to the integrated circuit for evaluation.

The circuit configuration disclosed can not only be used for voltage supply purposes, but it is also suitable for pads that form the termination of a 50 Ωcoaxial line, for example. In this case, the energy consumed because of the termination can be utilized for the voltage supply. To that end, the circuit configuration must be extended such that the line being terminated always sees a real and constant terminating resistance. The voltage dropped across this resistance can then be used for the on-chip voltage supply.

I claim:

1. A circuit, comprising:
   an integrated circuit having a plurality of voltage supply lines, a pad for configuring said integrated circuit;
   a Schmitt trigger having an input connected to said pad and an output connected to said integrated circuit;
   a circuit configuration for supplying voltage to said integrated circuit through said pad;
   said circuit configuration including switches;
   each one of said switches for connecting said pad to a respective one of said plurality of said voltage supply lines;
   said circuit configuration including a control circuit for switching said switches on and off; and
   said control circuit being controlled by at least one on-chip control signal;

said circuit configuration including driver circuits;

said control circuit switching each one of said switches on and off with a respective one of said driver circuits; and said driver circuits having inputs connected to said pad;

said circuit configuration including resistors;

said driver circuits having outputs; and each one of said outputs of said driver circuits connected to one of said plurality of said voltage supply lines by a respective one of said resistors.

2. The circuit according to claim 1, wherein said switches are power transistors.

3. A circuit, comprising:

an integrated circuit having a plurality of voltage supply lines, a pad for configuring said integrated circuit;

a Schmitt trigger having an input connected to said pad and an output connected to said integrated circuit;

a circuit configuration for supplying voltage to said integrated circuit through said pad;

said circuit configuration including switches;

each one of said switches for connecting said pad to a respective one of said plurality of said voltage supply lines;

said circuit configuration including a control circuit for switching said switches on and off; and said control circuit being controlled by at least one on-chip control signal;

said plurality of said voltage supply lines including a first voltage supply line and a second voltage supply line;

said switches including a first switch and a second switch;

said first switch connecting said pad to said first voltage supply line; and said second switch connecting said pad to said second voltage supply line;

said circuit configuration including a third transistor having a load path and a control terminal;

said load path of said third transistor connecting said pad to a line selected from the group consisting of said first voltage supply line and said second voltage supply line; and said control terminal of said third transistor connected to a line selected from the group consisting of said first voltage supply line and said second voltage supply line.

4. The circuit according to claim 3, wherein said switches are MOS transistors.

5. The circuit according to claim 3, wherein said switches are bipolar transistors.

* * * * *